United States Patent
Pelicia et al.

(10) Patent No.: US 11,043,893 B1
(45) Date of Patent: Jun. 22, 2021

(54) BIAS REGULATION SYSTEM

(71) Applicant: NXP USA, INC., Austin, TX (US)

(72) Inventors: Marcos Mauricio Pelicia, Campinas (BR); Ricardo Pureza Coimbra, Campinas (BR); Luis Enrique Del Castillo, Campinas (BR); Eduardo Ribeiro da Silva, Campinas (BR)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/885,052

(22) Filed: May 27, 2020

(51) Int. Cl.
| | |
|---|---|
| G05F 1/10 | (2006.01) |
| H02M 3/07 | (2006.01) |
| H02M 1/32 | (2007.01) |
| H03K 5/24 | (2006.01) |
| H02M 1/08 | (2006.01) |
| H03K 3/012 | (2006.01) |
| H02M 1/00 | (2006.01) |

(52) U.S. Cl.
CPC ............. *H02M 3/07* (2013.01); *H02M 1/08* (2013.01); *H03K 3/012* (2013.01); *H03K 5/2472* (2013.01); *H02M 2001/0012* (2013.01)

(58) Field of Classification Search
CPC combination set(s) only.
See application file for complete search history.

(56) References Cited

U.S. PATENT DOCUMENTS

| | | | |
|---|---|---|---|
| 5,973,944 A * | 10/1999 | Nork | H02M 1/44 307/110 |
| 7,173,477 B1 * | 2/2007 | Raghavan | H02M 3/07 327/536 |
| 7,990,741 B2 | 8/2011 | Martinussen | |
| 8,598,854 B2 * | 12/2013 | Soenen | G05F 1/575 323/274 |
| 9,293,986 B2 * | 3/2016 | Thandri | H02M 3/07 |
| 9,929,643 B2 | 3/2018 | Ribeiro Do Nascimento | |
| 10,050,526 B2 | 8/2018 | Zanetta | |
| 10,394,264 B1 | 8/2019 | Coimbra et al. | |
| 10,658,927 B1 | 5/2020 | Pelicia et al. | |

OTHER PUBLICATIONS

Blagojevic, M., "A Fast, Flexible, Positive and Negative Adaptive Body-Bias Generator in 28nm FDSOI", 2016 IEEE Symposium on VLSI Circuits (VLSI-Circuits), Jun. 15-17, 2016.
U.S. Appl. No. 16/876,619, filed May 18, 2020, entitled "Low Power Comparator".

* cited by examiner

*Primary Examiner* — An T Luu

(57) ABSTRACT

A bias circuit is provided. The bias circuit includes a comparator circuit configured to compare a first voltage at a first input with a second voltage at a second input and generate a digital value at an output. A level shifter circuit is coupled to the comparator circuit. The level shifter is configured to receive a reference voltage at an input and generate the second voltage at an output. A charge pump circuit is coupled to the comparator circuit. The charge pump circuit is configured to generate the first voltage at an output based on the digital value.

20 Claims, 4 Drawing Sheets

BIAS REGULATION SYSTEM

BACKGROUND

Field

This disclosure relates generally to electronic circuits, and more specifically, to a bias regulation system.

Related Art

Integrated circuits today may have hundreds of thousands to hundreds of millions of transistors which contribute to the overall power consumption of these integrated circuits. In CMOS technologies, a body, or well terminal of P-channel transistors is typically connected to a positive rail supply and a body, or well terminal of N-channel transistors is typically connected to ground rail supply. In some CMOS circuits, it may be desirable to bias body or well terminals at voltages other than rail voltages to reduce leakage current and thus reduce power consumption. However, challenges exist in performance, cost, and power consumption tradeoffs when designing a bias generation circuit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a low power bias regulator circuit. The low power bias regulator includes circuitry configured to provide back biasing voltages which extend beyond typical operational voltage ranges without using high voltage transistors. Level shifted reference voltages allow a feedback path from a charge pump output to a comparator input to have minimum delay and thus more stable voltage regulation. Utilizing switched capacitor technology in the reference voltage level shifter and comparator provide low power consumption and highly responsive voltage regulation.

Figure 1:
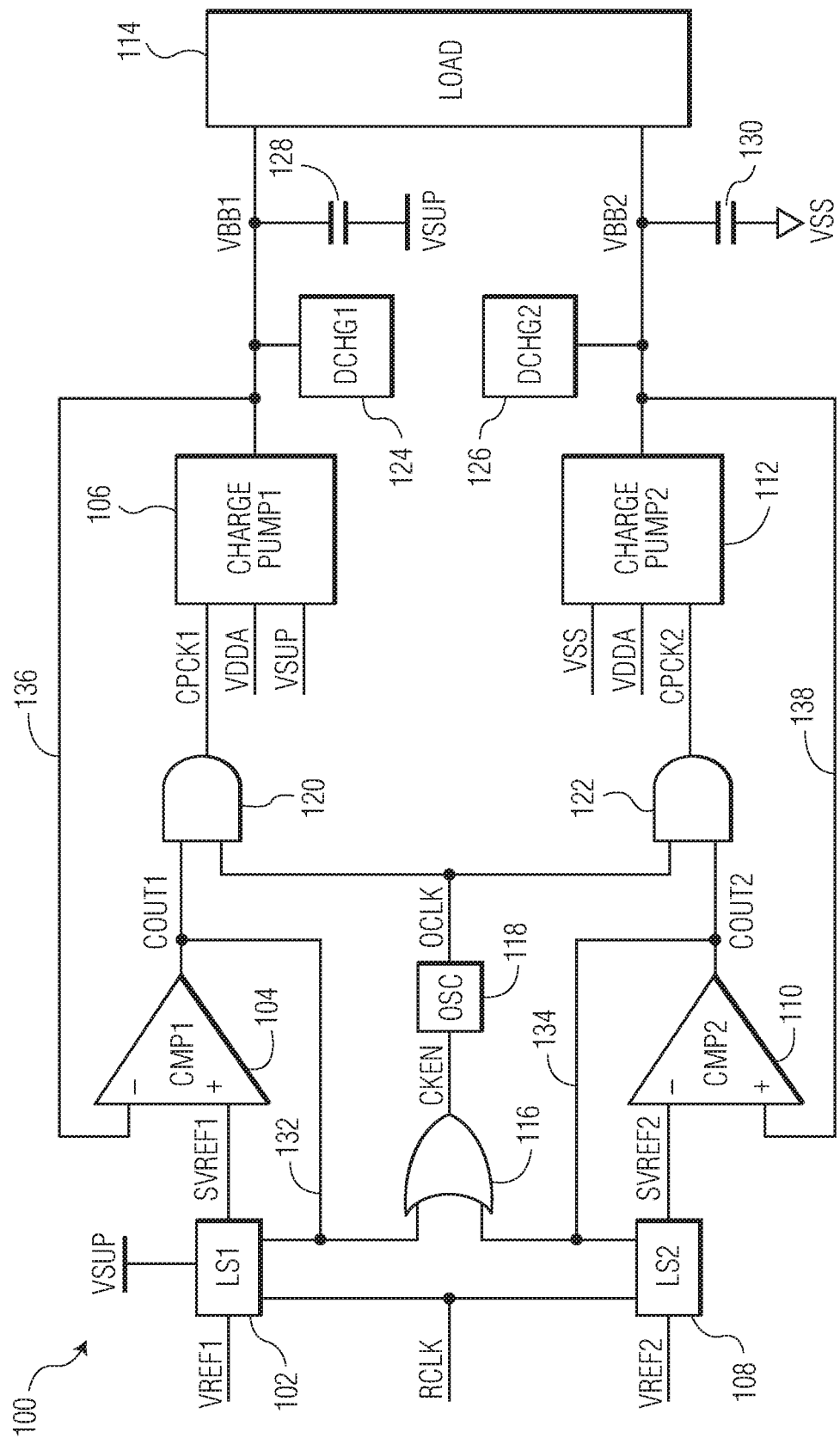
FIG. 1 illustrates, in simplified block diagram form, an example low power bias regulation system in accordance with an embodiment.

FIG. 1 illustrates, in simplified block diagram form, an example low power bias regulation system 100 in accordance with an embodiment. Bias regulation system 100 is implemented as an integrated circuit and has a first input terminal labeled VREF1 for receiving a first input voltage signal VREF1, a second input terminal labeled VREF2 for receiving a second input voltage signal VREF, a third input terminal labeled RCLK for receiving a refresh clock RCLK, voltage supply terminals labeled VDDA, VSUP, and VSS, a first output terminal labeled VBB1 for providing a first bias voltage VBB1, and a second output terminal labeled VBB2 for providing a second bias voltage VBB2. In this embodiment, an analog operating voltage (e.g., operating voltage for analog circuitry) is supplied at the VDDA supply terminal, an alternative voltage (e.g., offset voltage or voltage for operating digital circuitry) is supplied at the VSUP supply terminal, and a ground voltage is supplied at the VSS supply terminal. In this embodiment, bias regulation system 100 includes level shifter circuits 102 and 108, comparator circuits 104 and 110, charge pump circuits 106 and 112, load circuit 114, clock circuit 116-122, discharge circuits 124 and 126, and capacitors 128 and 130.

In this embodiment, the level shifter circuits 102 and 108, labeled LS1 and LS2 respectively, are characterized as high voltage tolerant level shifter circuits. The level shifter circuits 102 and 108 each have inputs to receive a reference voltage (e.g., VREF1, VREF2), the refresh clock RCLK, a digital feedback signal (e.g., COUT1, COUT2), and an output to provide a level shifted voltage (e.g., SVREF1, SVREF2). Each of the level shifters 102 and 108 is configured to generate the level shifted voltage based on the received reference voltage. For example, level shifter 102 is configured to generate the SVREF1 voltage by shifting the VREF1 voltage by a VSUP voltage amount such that SVREF1 substantially equals VREF1+VSUP, and level shifter 108 is configured to generate the SVREF2 voltage by shifting the VREF2 voltage such that SVREF2 substantially equals −VREF2. In this embodiment, the generated SVREF1 may exceed a maximum rail voltage (e.g., SVREF1>VDDA) and the generated SVREF2 voltage may exceed a minimum rail voltage (e.g., SVREF2<VSS). In some embodiments, level shifter 102 may be bypassed or may be configured to pass the VREF1 voltage through to the SVREF1 output when the desired SVREF1 voltage is within a normal operating rail voltage range such that SVREF1 equals VREF1. The voltages SVREF1 and SVREF2 from the level shifters 102 and 108 are provided to respective inputs of the comparator circuits 104 and 110. Each of the level shifters 102 and 108 is further configured to refresh the voltages SVREF1 and SVREF2 based on the RCLK and respective feedback signals COUT1 and COUT2 output from comparator circuits 104 and 110.

In this embodiment, the comparator circuits 104 and 110, labeled CMP1 and CMP2 respectively, are characterized as high voltage tolerant comparator circuits. The comparator circuits 104 and 110 each have a first input to receive a first input voltage (e.g., VBB1, VBB2), a second input to receive a second input voltage (e.g., SVREF1, SVREF2), and an output to provide a digital value (e.g., COUT1, COUT2 signals). Each of the comparators 104 and 110 is configured to compare the first input voltage at the first input with the second input voltage at the second input and in turn, generate the digital value based on a difference between the first input voltage and the second input voltage. For example, when the first input voltage is greater than the second input voltage, the digital value output signal will be at a first logic level, and when the first input voltage is less than the second input voltage, the digital value output signal will be at a second logic value. In this embodiment, each of the comparator output signals COUT1 and COUT2 is fed back to respective digital feedback signal inputs of level shifters 102 and 108 by way of feedback paths 132 and 134.

The charge pump circuits 106 and 112, labeled CHARGE PUMP1 and CHARGE PUMP2 respectively, each have inputs to receive a clock signal (e.g., CPCK1, CPCK2), a first input voltage (e.g., VDDA), a second input voltage (e.g., VSUP, VSS), and an output to provide a charge pumped output voltage (e.g., VBB1, VBB2). Each of the charge pumps 106 and 112 is configured to generate a desired charge pumped output voltage based on the clock signal and input voltages. For example, charge pump 106 is configured to generate the first bias voltage VBB1, and charge pump 112 is configured to generate the second bias voltage VBB2. In this embodiment, the generated VBB1 voltage is fed back to the first input of comparator 104 by way of feedback path 136, and the generated VBB2 voltage is fed back to the first input of comparator 110 by way of feedback path 138.

In this embodiment, charge pumps 106 and 112 are coupled to the load circuit 114 and configured to provide respective bias voltages for devices of the load circuit. For example, the output of charge pump 106 may be coupled to N-wells of P-channel transistors in the load circuit 114 such that the generated VBB1 voltage serves as a back bias voltage for the P-channel transistors. Likewise, the output of charge pump 112 may be coupled to P-wells of N-channel transistors in the load circuit 114 such that the generated VBB2 voltage serves as a back bias voltage for the N-channel transistors. In this embodiment, the P-channel and N-channel transistors of the load circuit 114 may be supplied by rail voltages VSUP and VSS. The generated VBB1 voltage may exceed a maximum rail voltage (e.g., VBB1>VSUP) and the generated VBB2 voltage may exceed a minimum rail voltage (e.g., VBB2<VSS). In this embodiment, the load circuit 114 may include any suitable circuitry having a well or body which may be coupled to receive the charge pumped output voltage as a back bias voltage.

The clock circuit of the bias regulation system 100 is configured to generate charge pump clocks CPCK1 and CPCK2 based on the comparator output signals COUT1 and COUT2 respectively. For example, when the VBB1 voltage drops below the SVREF1 voltage, the resulting COUT1 signal serves to enable the CPCK1 clock generation. The charge pump 106 resumes pumping based on the CPCK1 clock, and in turn, increases the VBB1 voltage to the desired value (e.g., SVREF1). In this embodiment, an example implementation of the clock circuit includes an OR gate 116, an oscillator clock circuit 118 labeled OSC, and AND gates 120 and 122.

A first input of OR gate 116 is coupled to the output of the comparator 104 to receive the COUT1 signal, and a second input of OR gate 116 is coupled to the output of the comparator 110 to receive the COUT2 signal. An output of the OR gate 116 labeled CKEN is coupled to an input of the oscillator 118 and serves as an enable signal to the oscillator 118. For example, in the clock circuit configuration depicted in FIG. 1, when either of the comparator output signals COUT1 and COUT2 is at a logic high state, the CKEN signal is at a logic high state enabling the oscillator 118 to generate an oscillator clock signal OCLK at an output labeled OCLK. In other embodiments, other clock circuit configurations may be implemented to enable and generate the CPCK1 and CPCK2 clock signals.

A first input of AND gate 120 is coupled to the output of the comparator 104 to receive the COUT1 signal, and a second input of AND gate 120 is coupled to the output of the oscillator 118 to receive the OCLK signal. An output of the AND gate 120 labeled CPCK1 is coupled to an input of the charge pump 106 to provide the charge pump clock signal CPCK1. Likewise, a first input of AND gate 122 is coupled to the output of the comparator 110 to receive the COUT2 signal, and a second input of AND gate 122 is coupled to the output of the oscillator 118 to receive the OCLK signal. An output of the AND gate 122 labeled CPCK2 is coupled to an input of the charge pump 112 to provide the charge pump clock signal CPCK2.

The discharge circuits 124 and 126, labeled DCHG1 and DCHG2 respectively, are coupled at the VBB1 and VBB2 outputs. Each of the discharge circuits 124 and 126 are configured to be enabled during voltage change transitions (e.g., VREF1, VREF2 changes). For example, to facilitate an on-the-fly change to a lower VBB1 voltage, the discharge circuit 124 may be enabled to assist a more rapid transition to the lower VBB1 voltage. In this embodiment, each of the discharge circuits 124 and 126 are configured to be enabled based on the respective comparator output signals COUT1 and COUT2.

The capacitors 128 and 130 are coupled at the VBB1 and VBB2 outputs, respectively. A first terminal of capacitor 128 is coupled at the VBB1 output and the second terminal of capacitor 128 is coupled at the VSUP supply terminal. A first terminal of capacitor 130 is coupled at the VBB2 output and the second terminal of capacitor 130 is coupled at the VSS supply terminal. In this embodiment, capacitors 128 and 130 serve to filter and stabilize the respective generated VBB1 and VBB2 voltages.

Figure 2A:
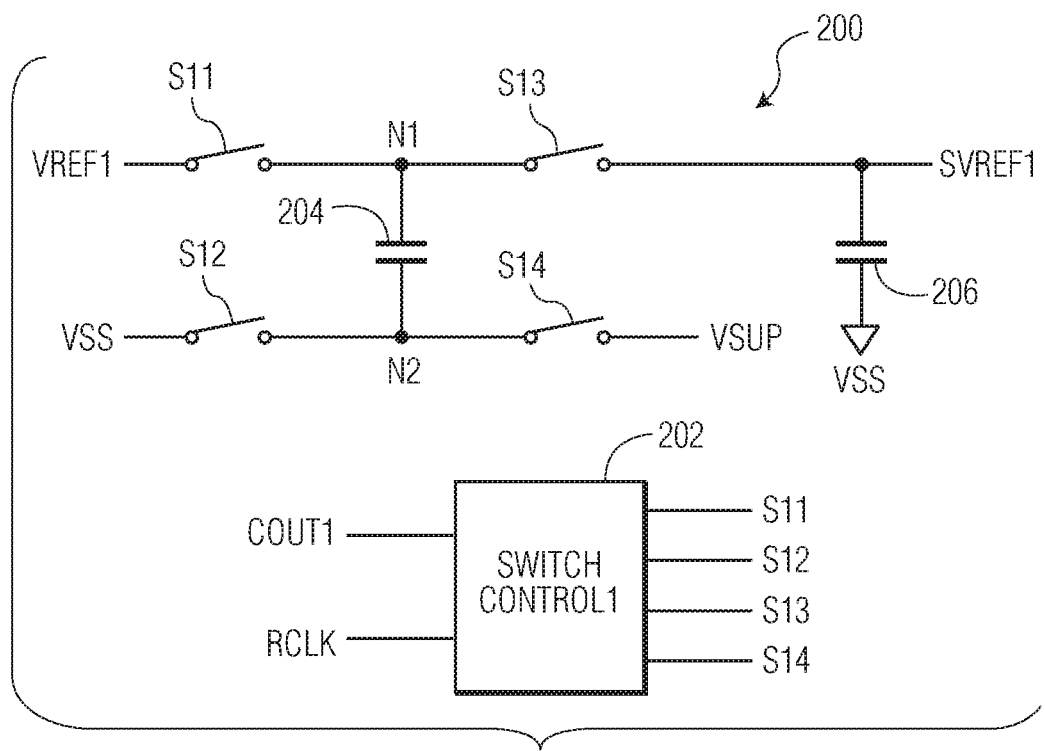
FIG. 2A and FIG. 2B illustrate, in simplified schematic diagram form, an example level shifter circuit implementation in accordance with an embodiment.
Figure 2B:
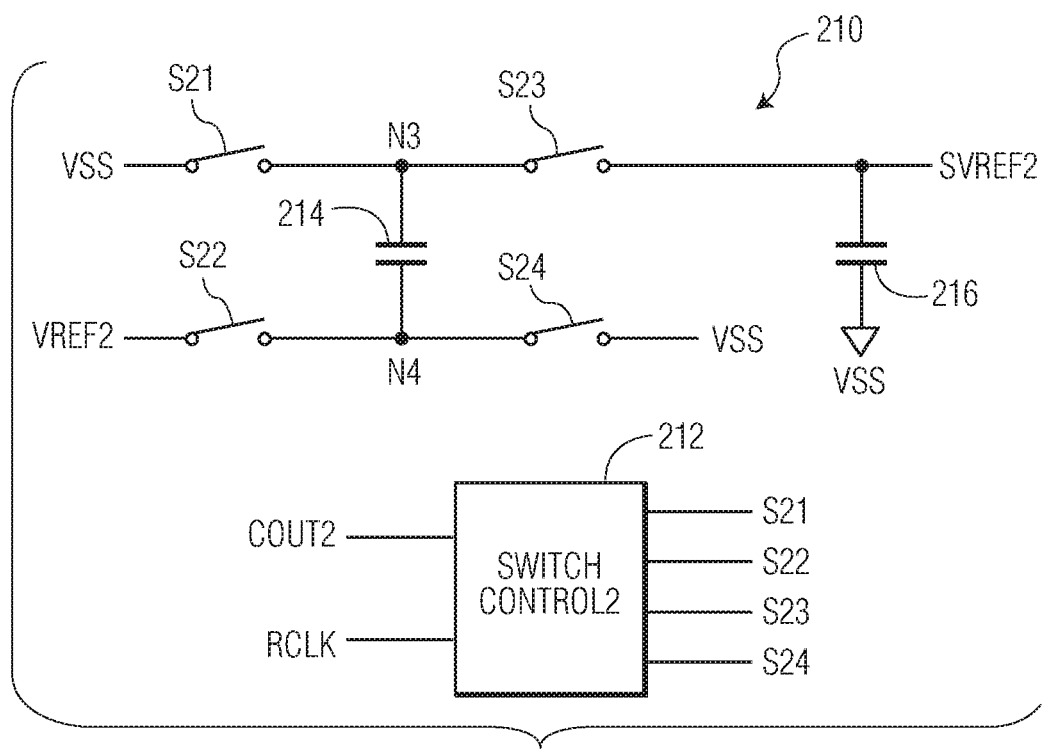

FIG. 2A and FIG. 2B illustrate, in simplified schematic diagram form, example level shifter circuit implementations 200 and 210 in accordance with an embodiment. Level shifters 200 and 210 correspond to the level shifters 102 and 108 of FIG. 1, respectively. In this embodiment, the level shifter 200 and 210 are characterized as high voltage tolerant level shifter circuits. For example, level shifter 200 is configured to generate a level shifted reference voltage (e.g., SVREF1) that may exceed a maximum rail voltage and level shifter 210 is configured to generate a level shifted reference voltage (e.g., SVREF2) that may exceed a minimum rail voltage.

Figure 2C:
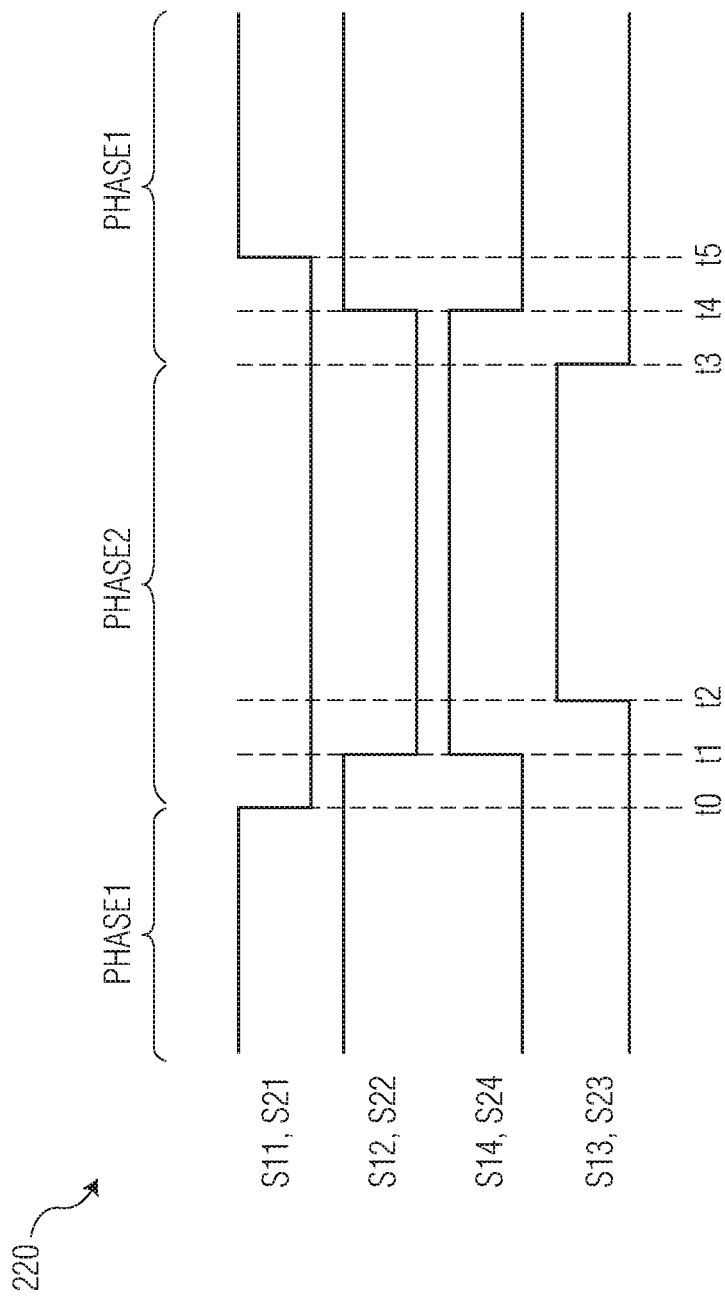
FIG. 2C illustrates, in plot diagram form, example level shifter switch timing in accordance with an embodiment.

The level shifter 200 includes a switch control circuit 202, switches S11-S14, and capacitors 204 and 206. The switch control circuit 202 includes inputs to receive the COUT1 digital signal and the RCLK signal, and outputs for providing switch control signals S11-S14. In this embodiment, the switch control circuit 202 is configured to generate a predetermined switch control signal timing sequence as depicted in FIG. 2C based on the COUT1 and RCLK signals. In operation, the control signal timing sequence is used for refreshing or updating the level shifted voltage SVREF1 based on the VREF1 voltage. For example, the COUT1 signal may trigger the switch control timing sequence to run for a predetermined number of cycles sufficient to refresh or update the SVREF1 voltage. Alternatively, the switch control timing sequence may run continuously or periodically, by way of the RCLK, to refresh or update the SVREF1 voltage.

In this embodiment, the switches S11-S14 and capacitors 204 and 206 are configured and arranged to form a switched capacitor level shifting circuit. A first terminal of switch S11 is coupled to the VREF1 input and a second terminal of switch S11 is coupled to a first terminal of switch S13 and a first terminal of capacitor 204 at node N1. A first terminal of switch S12 is coupled to the VSS supply terminal and a second terminal of switch S12 is coupled to a first terminal of switch S14 and a second terminal of capacitor 204 at node N2. A second terminal of switch S13 is coupled to the SVREF1 output and a first terminal of capacitor 206, and a second terminal of capacitor 206 is coupled to the VSS supply terminal. A second terminal of switch S14 is coupled to the VSUP supply terminal.

In operation, when switches S11 and S12 are closed (e.g., conducting) and switches S13 and S14 are open (e.g., non-conducting), capacitor 204 is charged to the VREF1 voltage level while capacitor 206 is kept in a hold state. When switches S11 and S12 are open and switches S13 and S14 are closed, capacitor 204 is coupled to capacitor 206 such that capacitor 206 to charged to a VREF1+VSUP voltage level to generate the level shifted output voltage SVREF1. In some embodiments, level shifter 200 may be configured to pass the VREF1 voltage through to the SVREF1 output (e.g., switches S11-S13 closed, S14 opened) when the desired SVREF1 voltage is within a normal operating rail voltage range such that SVREF1 equals VREF1.

The level shifter 210 includes a switch control circuit 212, switches S21-S24, and capacitors 214 and 216. The switch control circuit 212 includes inputs to receive the COUT2 digital signal and the RCLK signal, and outputs for providing switch control signals S21-S24. In this embodiment, the switch control circuit 212 is configured to generate a predetermined switch control signal timing sequence as depicted in FIG. 2C based on the COUT1 and RCLK signals. In operation, the control signal timing sequence is used for refreshing or updating the level shifted voltage SVREF2 based on the VREF2 voltage. For example, the COUT2 signal may trigger the switch control timing sequence to run for a predetermined number of cycles sufficient to refresh or update the SVREF2 voltage. Alternatively, the switch control timing sequence may run continuously or periodically, by way of the RCLK, to refresh or update the SVREF1 voltage.

In this embodiment, the switches S21-S24 and capacitors 214 and 216 are configured and arranged to form a switched capacitor level shifting circuit. A first terminal of switch S21 is coupled to the VSS supply terminal and a second terminal of switch S21 is coupled to a first terminal of switch S23 and a first terminal of capacitor 214 at node N3. A first terminal of switch S22 is coupled to the VREF2 input and a second terminal of switch S22 is coupled to a first terminal of switch S24 and a second terminal of capacitor 214 at node N4. A second terminal of switch S23 is coupled to the SVREF2 output and a first terminal of capacitor 216, and a second terminal of capacitor 216 is coupled to the VSS supply terminal. A second terminal of switch S24 is coupled to the VSS supply terminal.

In operation, when switches S21 and S22 are closed (e.g., conducting) and switches S23 and S24 are open (e.g., non-conducting), capacitor 214 is charged to a negative VREF2 voltage level while capacitor 216 is kept in a hold state. When switches S21 and S22 are open and switches S23 and S24 are closed, capacitor 214 is coupled to capacitor 216 such that capacitor 216 is charged to the negative voltage level to generate the level shifted output voltage SVREF2.

FIG. 2C illustrates, in plot diagram form, example level shifter switch control signal timing sequence 220 in accordance with an embodiment. In this embodiment, the timing sequence 220 includes control signal timing waveforms S11-S14 and S21-S24 corresponding to respective switches S11-S14 and S21-S24 depicted in FIG. 2A and FIG. 2B. For illustration purposes, each control signal waveform shown in the timing sequence 220 is representative of two controls signals. For example, the waveform labeled S11,S21 is representative of each of the S11 and S21 control signal timing waveforms, and likewise for waveforms labeled S12,S22-S14,S24. The waveforms S11,S21-S14,S24 illustrated in FIG. 2C are shown with logic high and logic low values versus time. For example, the waveform logic high time corresponds to a closed switch state period and the waveform logic low time corresponds to an open switch state period of respective switches S11-S14 and S21-S24.

In this embodiment, control signals S11,S21-S14,S24 may be formed as non-overlapping signals to facilitate sequencing of respective switches S11-S14 and S21-S24 (e.g., opening and closing transitions) in a manner sufficient to maximize charge conservation. For example, a first sequencing of control signals S11,S21-S14,S24 is depicted during a transition from PHASE1 (e.g., charging capacitors 204 and 214) to PHASE2 (e.g., transferring charge to capacitors 206 and 216) and a second sequencing of control signals S11,S21-S14,S24 is depicted during a transition from PHASE2 to PHASE1. In the PHASE1 to PHASE2 control signal sequence of the level shifters 200 and 210, the S11 and S21 switches are opened at time t0. At time t1, the S12 and S22 switches are opened and the S14 and S24 switches are closed. At time t2, the S13 and S22 switches are closed. In the PHASE2 to PHASE1 control signal sequence of the level shifters 200 and 210, the S13 and S23 switches are opened at time t3. At time t4, the S12 and S22 switches are closed and the S14 and S24 switches are opened. At time t5, the S11 and S21 switches are closed.

Figure 3A:
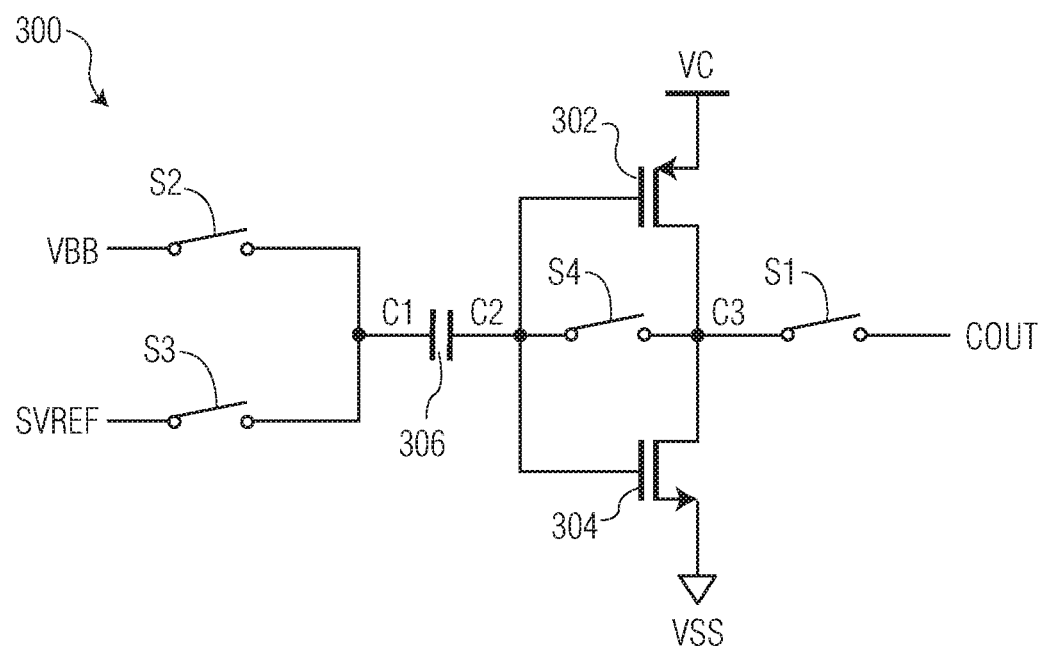
FIG. 3A illustrates, in simplified schematic diagram form, example comparator circuit implementation in accordance with an embodiment.

FIG. 3A illustrates, in simplified schematic diagram form, example comparator circuit implementation 300 in accordance with an embodiment. The comparator circuit 300 is an example implementation of each of the comparators 104 and 110 of FIG. 1. In this embodiment, the comparator circuit 300 is characterized as high voltage tolerant comparator circuit 300. For example, comparator circuit 300 is configured to generate a digital value based on a difference between input signals which may exceed a maximum rail voltage (e.g., comparator 104) or may exceed a minimum rail voltage (e.g., comparator 110). The comparator circuit 300 has a first input terminal labeled VBB for receiving a charge pump output voltage signal (e.g., VBB1, VBB2), a second input terminal labeled SVREF for receiving a level shifted reference voltage signal (e.g., SVREF1, SVREF2), an output terminal labeled COUT (e.g., COUT1, COUT2). In this embodiment, the comparator circuit 300 includes a P-channel transistor 302, an N-channel transistor 304, a capacitor 306, and switches S1-S4.

The input terminals VBB and SVREF are selectively coupled to an input of an inverter stage by way of capacitor 306 and switches S2 and S3. In this embodiment, the transistors 302 and 304 are configured and arranged to form the inverter stage. A first current electrode of transistor 302 is coupled to a VC supply terminal to receive an operating voltage VC for the inverter stage. A second current electrode of transistor 302 is coupled to a first current electrode of transistor 304 at node C3 and a second current electrode of transistor 304 is coupled at the VSS supply terminal. A control electrode of transistor 302 is coupled to a control electrode of transistor 304 and a first terminal of capacitor 306 at input node C2. A second terminal of capacitor 306 is coupled to a first terminal of switch S2 and a first terminal of switch S3 at node C1. A second terminal of switch S2 is coupled at the VBB terminal and a second terminal of switch S3 is coupled at the SVREF terminal. A first terminal of switch S4 is coupled at the node C2 and a second terminal of switch S4 is coupled at the node C3. An output of the inverter stage is coupled to a first terminal of switch S1 at node C3 and a second terminal of switch S1 is coupled at the COUT terminal In operation, the inverter stage along with the switches S1-S4 are configured to compare the first input voltage VBB with the second input voltage SVREF and in turn, generate a digital value at the COUT output based on the difference between the first input voltage VBB and the second input voltage SVREF. The comparator circuit 300 may include one or more gain stages coupled to the output of the inverter stage to propagate the COUT signal with fast transition times and minimal power. In this embodiment, the VC operating voltage may be generated by way of a voltage generation circuit configured to limit short circuit current or peak currents in the transistors of the inverter stage.

Figure 3B:
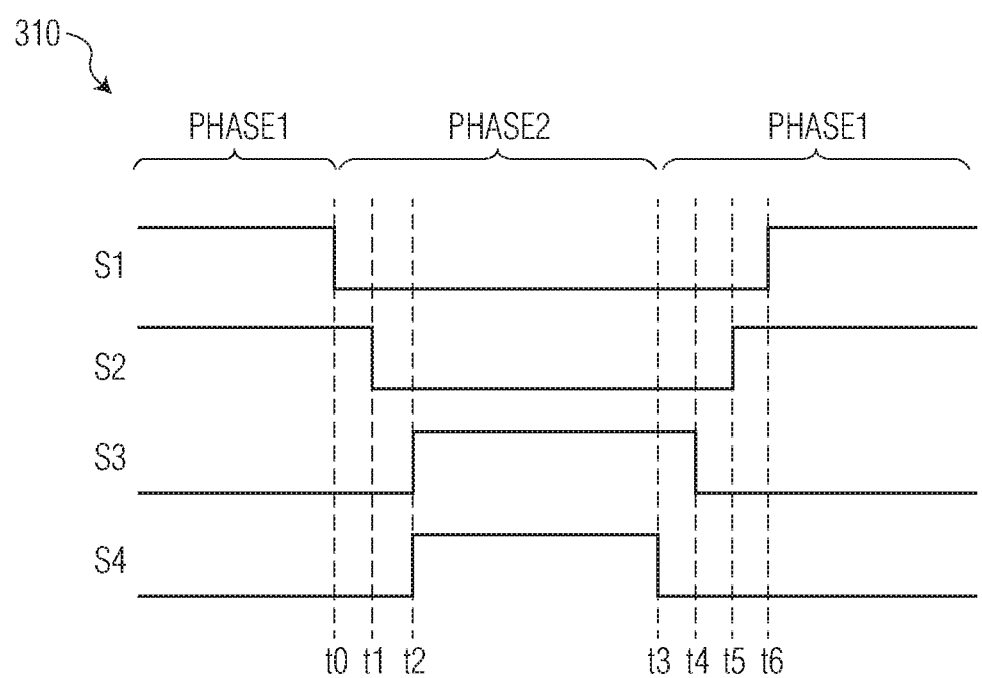
FIG. 3B illustrates, in plot diagram form, example comparator switch timing in accordance with an embodiment.

FIG. 3B illustrates, in plot diagram form, example comparator switch control signal timing sequence 310 of the example comparator circuit 300 in accordance with an embodiment. The switch timing 304 includes control signal timing waveforms S1-S4 corresponding to switches S1-S4 as depicted in FIG. 3A. The waveforms S1-S4 illustrated in FIG. 3B are shown with logic high and logic low values versus time. For example, the waveform logic high time corresponds to a closed switch state period and the waveform logic low time corresponds to an open switch state period of switches S1-S4.

In this embodiment, control signals S1-S4 may be formed as non-overlapping signals to facilitate sequencing of switches S1-S4 (e.g., opening and closing transitions) in a manner sufficient to minimize charge injection, redistribution, and/or cross-conduction. For example, a first sequencing of control signals S1-S4 is depicted during a transition from PHASE1 (e.g., monitoring state) to PHASE2 (e.g., calibration state) and a second sequencing of control signals S1-S4 is depicted during a transition from PHASE2 to PHASE1. In the PHASE1 to PHASE2 control signal sequence of the comparator circuit 300, the S1 switch is opened at time t0. At time t1, the S2 switch is opened, and at time t2, the S3 and S4 switches are closed. In the PHASE2 to PHASE1 control signal sequence of the comparator core circuit 300, the S4 switch is opened at time t3. At time t4, the S3 switch is opened, and at time t5, the S2 switch is closed. At time t6, the S1 switch is closed.

Generally, there is provided, a bias circuit including a comparator circuit configured to compare a first voltage at a first input with a second voltage at a second input and generate a digital value at an output; a level shifter circuit coupled to the comparator circuit, the level shifter configured to receive a reference voltage at an input and generate the second voltage at an output; and a charge pump circuit coupled to the comparator circuit, the charge pump circuit configured to generate the first voltage at an output based on the digital value. The level shifter circuit may be further configured to receive the digital value and refresh the second voltage based on the digital value. The level shifter circuit may be configured to generate the second voltage by level shifting the reference voltage to a voltage value exceeding a supply voltage. The level shifter circuit may include a switched capacitor circuit configured to generate the second voltage. The comparator circuit may include a switched capacitor circuit configured to sample the first voltage during a first phase and sample the second voltage during a second phase. The comparator circuit may be further configured to generate the digital value based on a difference between the first voltage and the second voltage. The charge pump circuit may be configured to generate the first voltage as a body bias voltage for a load circuit. The bias circuit may further include a clock circuit configured to generate a clock signal for the charge pump circuit, the clock signal enabled based on the digital value. The bias circuit may further include a discharge circuit coupled at the output of the charge pump circuit, the discharge circuit configured to assist a transition from the first voltage to a third voltage.

In another embodiment, there is provided, a bias circuit including a charge pump circuit configured to generate a bias voltage at an output; a comparator circuit configured to compare a first voltage at a first input with a second voltage at a second input and generate a digital value at an output based on a difference between the first voltage and the second voltage, the output of the comparator circuit coupled to an input of the charge pump circuit; a first feedback path coupled between the output of the charge pump circuit and the first input of the comparator circuit, the first feedback path configured to provide the bias voltage as the first voltage; and a level shifter circuit coupled to the comparator circuit, the level shifter configured to receive a reference voltage at a first input and generate the second voltage at an output. The bias circuit may further include a second feedback path coupled between the output of the comparator circuit and a second input of the level shifter circuit, the second feedback path configured to provide the digital value to the level shifter circuit and refresh the second voltage based on the digital value. The level shifter circuit may be configured to generate the second voltage by level shifting the reference voltage to a voltage value exceeding a supply voltage. The level shifter circuit may include a switched capacitor circuit configured to generate the second voltage. The comparator circuit may include a switched capacitor circuit configured to sample the first voltage during a first phase and sample the second voltage during a second phase. The charge pump circuit may be configured to generate the bias voltage as a body bias voltage for a load circuit. The bias circuit may further include a clock circuit configured to generate a clock signal for the charge pump circuit, the clock signal enabled based on the digital value.

In yet another embodiment, there is provided, a bias circuit including a charge pump circuit configured to generate a bias voltage at an output; a comparator circuit configured to compare a first voltage at a first input with a second voltage at a second input and generate a digital value at an output, the output of the comparator circuit coupled to an input of the charge pump circuit; a first feedback path coupled between the output of the charge pump circuit and the first input of the comparator circuit, the first feedback path configured to provide the bias voltage as the first voltage; and a level shifter circuit coupled to the comparator circuit, the level shifter configured to receive a reference voltage at a first input and generate the second voltage at an output. The bias circuit may further include a second feedback path coupled between the output of the comparator circuit and a second input of the level shifter circuit, the second feedback path configured to provide the digital value to the level shifter circuit and refresh the second voltage based on the digital value. The level shifter circuit may include a switched capacitor circuit configured to generate the second voltage. The comparator circuit may include a switched capacitor circuit configured to sample the first voltage during a first phase and sample the second voltage during a second phase.

By now it should be appreciated that there has been provided, a low power bias regulator circuit. The low power bias regulator includes circuitry configured to provide back biasing voltages which extend beyond typical operational voltage ranges without using high voltage transistors. Level shifted reference voltages allow a feedback path from a charge pump output to a comparator input to have minimum delay and thus more stable voltage regulation. Utilizing switched capacitor technology in the reference voltage level shifter and comparator provide low power consumption and highly responsive voltage regulation.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A bias circuit comprising:
   a comparator circuit configured to compare a first voltage at a first input with a second voltage at a second input and generate a digital value at an output;
   a level shifter circuit coupled to the comparator circuit, the level shifter configured to receive a reference voltage at an input and generate the second voltage at an output;
   a charge pump circuit coupled to the comparator circuit, the charge pump circuit configured to generate the first voltage at an output based on the digital value; and
   a clock circuit configured to generate a clock signal for the charge pump circuit, the clock signal enabled based on the digital value.

2. The bias circuit of claim 1, wherein the level shifter circuit is further configured to receive the digital value and refresh the second voltage based on the digital value.

3. The bias circuit of claim 1, wherein the level shifter circuit is configured to generate the second voltage by level shifting the reference voltage to a voltage value exceeding a supply voltage.

4. The bias circuit of claim 1, wherein the level shifter circuit comprises a switched capacitor circuit configured to generate the second voltage.

5. The bias circuit of claim 1, wherein the comparator circuit comprises a switched capacitor circuit configured to sample the first voltage during a first phase and sample the second voltage during a second phase.

6. The bias circuit of claim 1, wherein the comparator circuit is further configured to generate the digital value based on a difference between the first voltage and the second voltage.

7. The bias circuit of claim 1, wherein the charge pump circuit is configured to generate the first voltage as a body bias voltage for a load circuit.

8. The bias circuit of claim 1, further comprising a discharge circuit coupled at the output of the charge pump circuit, the discharge circuit configured to assist a transition from the first voltage to a third voltage.

9. A bias circuit comprising:
   a charge pump circuit configured to generate a bias voltage at an output;
   a comparator circuit configured to compare a first voltage at a first input with a second voltage at a second input and generate a digital value at an output based on a difference between the first voltage and the second voltage, the output of the comparator circuit coupled to an input of the charge pump circuit;
   a first feedback path coupled between the output of the charge pump circuit and the first input of the comparator circuit, the first feedback path configured to provide the bias voltage as the first voltage;
   a level shifter circuit coupled to the comparator circuit, the level shifter configured to receive a reference voltage at a first input and generate the second voltage at an output; and
   a second feedback path coupled between the output of the comparator circuit and a second input of the level shifter circuit, the second feedback path configured to provide the digital value to the level shifter circuit and refresh the second voltage based on the digital value.

10. The bias circuit of claim 9, wherein the level shifter circuit is configured to generate the second voltage by level shifting the reference voltage to a voltage value exceeding a supply voltage.

11. The bias circuit of claim 9, wherein the level shifter circuit comprises a switched capacitor circuit configured to generate the second voltage.

12. The bias circuit of claim 9, wherein the comparator circuit comprises a switched capacitor circuit configured to sample the first voltage during a first phase and sample the second voltage during a second phase.

13. The bias circuit of claim 9, wherein the charge pump circuit is configured to generate the bias voltage as a body bias voltage for a load circuit.

14. The bias circuit of claim 9, further comprising a clock circuit configured to generate a clock signal for the charge pump circuit, the clock signal enabled based on the digital value.

15. A bias circuit comprising:
   a charge pump circuit configured to generate a bias voltage at an output;
   a comparator circuit configured to compare a first voltage at a first input with a second voltage at a second input and generate a digital value at an output, the output of the comparator circuit coupled to an input of the charge pump circuit, the comparator circuit comprising a switched capacitor circuit configured to sample the first voltage during a first phase and sample the second voltage during a second phase;
   a first feedback path coupled between the output of the charge pump circuit and the first input of the comparator circuit, the first feedback path configured to provide the bias voltage as the first voltage; and a level shifter circuit coupled to the comparator circuit, the level shifter configured to receive a reference voltage at a first input and generate the second voltage at an output.

16. The bias circuit of claim 15, further comprising a second feedback path coupled between the output of the comparator circuit and a second input of the level shifter circuit, the second feedback path configured to provide the digital value to the level shifter circuit and refresh the second voltage based on the digital value.

17. The bias circuit of claim 15, wherein the level shifter circuit comprises a switched capacitor circuit configured to generate the second voltage.

18. A bias circuit comprising:
a comparator circuit configured to compare a first voltage at a first input with a second voltage at a second input and generate a digital value at an output;
a level shifter circuit coupled to the comparator circuit, the level shifter configured to receive a reference voltage at an input and generate the second voltage at an output, the level shifter further configured further configured to receive the digital value and refresh the second voltage based on the digital value; and
a charge pump circuit coupled to the comparator circuit, the charge pump circuit configured to generate the first voltage at an output based on the digital value.

19. A bias circuit comprising:
a charge pump circuit configured to generate a bias voltage at an output;
a comparator circuit configured to compare a first voltage at a first input with a second voltage at a second input and generate a digital value at an output based on a difference between the first voltage and the second voltage, the output of the comparator circuit coupled to an input of the charge pump circuit, the comparator circuit comprising a switched capacitor circuit configured to sample the first voltage during a first phase and sample the second voltage during a second phase;
a first feedback path coupled between the output of the charge pump circuit and the first input of the comparator circuit, the first feedback path configured to provide the bias voltage as the first voltage; and
a level shifter circuit coupled to the comparator circuit, the level shifter configured to receive a reference voltage at a first input and generate the second voltage at an output.

20. A bias circuit comprising:
a charge pump circuit configured to generate a bias voltage at an output;
a comparator circuit configured to compare a first voltage at a first input with a second voltage at a second input and generate a digital value at an output, the output of the comparator circuit coupled to an input of the charge pump circuit;
a first feedback path coupled between the output of the charge pump circuit and the first input of the comparator circuit, the first feedback path configured to provide the bias voltage as the first voltage;
a level shifter circuit coupled to the comparator circuit, the level shifter configured to receive a reference voltage at a first input and generate the second voltage at an output; and
a second feedback path coupled between the output of the comparator circuit and a second input of the level shifter circuit, the second feedback path configured to provide the digital value to the level shifter circuit and refresh the second voltage based on the digital value.

* * * * *